United States Patent
Saito

(10) Patent No.: US 6,947,263 B2
(45) Date of Patent: Sep. 20, 2005

(54) CPP MODE MAGNETIC SENSING ELEMENT INCLUDING A MULTILAYER FREE LAYER BIASED BY AN ANTIFERROMAGNETIC LAYER

(75) Inventor: Masamichi Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 166 days.

(21) Appl. No.: 10/409,387

(22) Filed: Apr. 8, 2003

(65) Prior Publication Data

US 2003/0197987 A1 Oct. 23, 2003

(30) Foreign Application Priority Data

Apr. 17, 2002 (JP) ........................................ 2002-114296

(51) Int. Cl.[7] ............................................... G11B 5/39
(52) U.S. Cl. ............................................... 360/324.12
(58) Field of Search ............................ 360/324.1, 324.11, 360/324.12, 324.2

(56) References Cited

U.S. PATENT DOCUMENTS

| | | | | |
|---|---|---|---|---|
| 5,408,377 | A | | 4/1995 | Gurney et al. ............. 360/325 |
| 6,221,172 | B1 | | 4/2001 | Saito et al. .................. 148/108 |
| 6,259,586 | B1 | | 7/2001 | Gill ........................... 360/324.2 |
| 6,424,506 | B1 | | 7/2002 | Saito et al. ............. 360/324.11 |
| 6,466,419 | B1 | * | 10/2002 | Mao ....................... 360/324.12 |
| 6,473,279 | B2 | * | 10/2002 | Smith et al. ............ 360/324.12 |
| 6,704,175 | B2 | * | 3/2004 | Li et al. .................. 360/324.11 |
| 6,714,388 | B2 | * | 3/2004 | Hasegawa et al. ...... 360/324.11 |
| 6,778,363 | B2 | * | 8/2004 | Meguro et al. ......... 360/324.11 |
| 6,826,022 | B2 | * | 11/2004 | Umetsu .................. 360/324.12 |
| 2001/0040779 | A1 | | 11/2001 | Pinarbasi ................ 360/324.11 |
| 2002/0034055 | A1 | * | 3/2002 | Seyama et al. ......... 360/324.11 |

FOREIGN PATENT DOCUMENTS

| | | |
|---|---|---|
| EP | 0 758 783 A1 | 2/1997 |
| GB | 2 388 701 | 11/2003 |

OTHER PUBLICATIONS

Copy of Office Action dated Jan. 19, 2005 for corresponding British Patent Application No. GB 306795.6.

* cited by examiner

*Primary Examiner*—Jefferson Evans
(74) *Attorney, Agent, or Firm*—Brinks Hofer Gilson & Lione

(57) ABSTRACT

In a CPP magnetic sensing element, a free magnetic layer has a laminated ferrimagnetic structure. Since the physical thickness of the free magnetic layer is increased, the product of a change in resistance $\Delta R$ and an area A can be improved and read output can be improved. Since the magnetic thickness is decreased, the demagnetizing field of the free magnetic layer is weakened, and it is possible to stably apply a continuous bias with a proper magnitude from the second of two antiferromagnetic layers to the first free magnetic sublayer. Therefore, it is possible to fabricate a magnetic sensing element with satisfactory read sensitivity $\eta$.

8 Claims, 8 Drawing Sheets

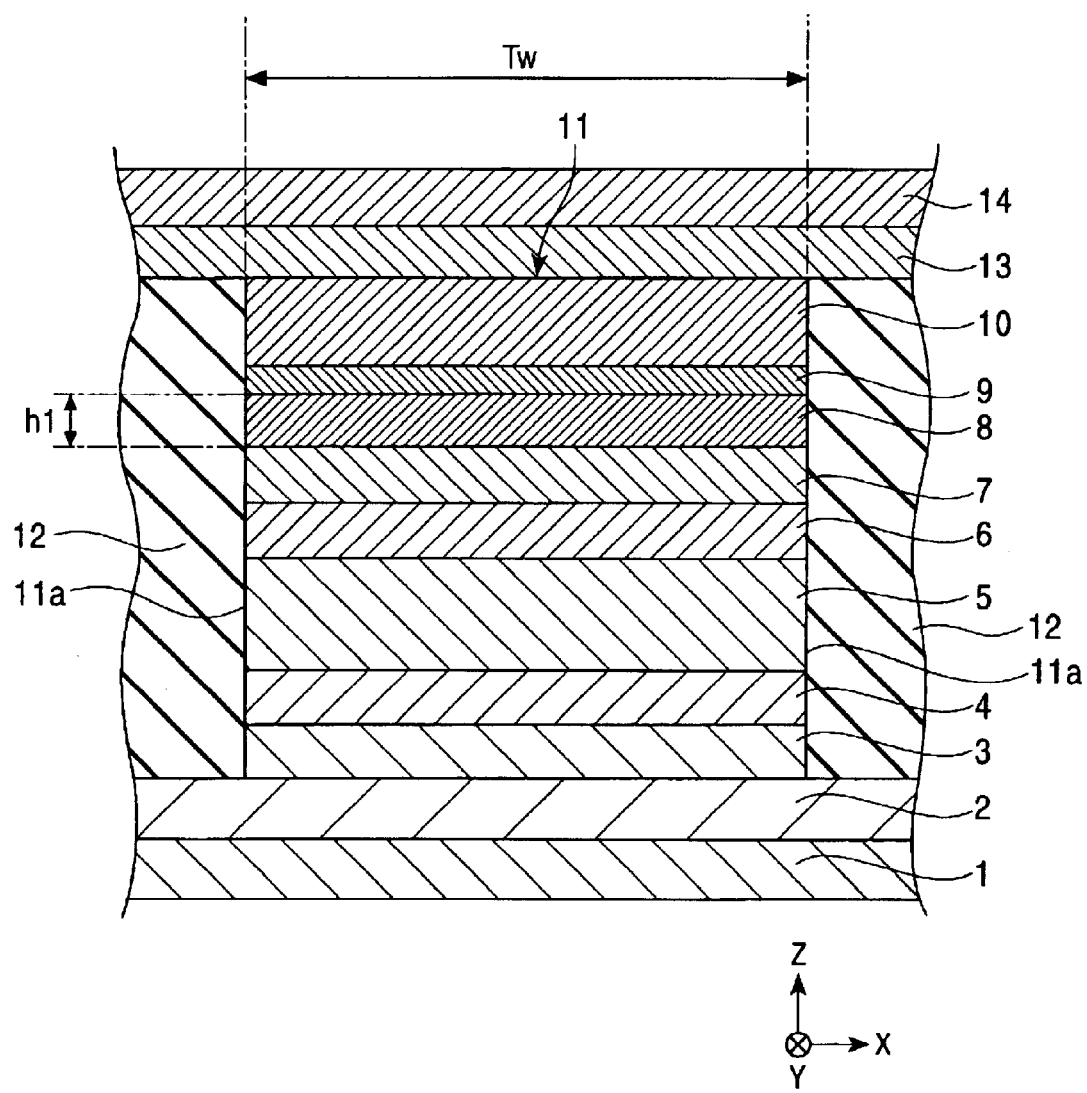

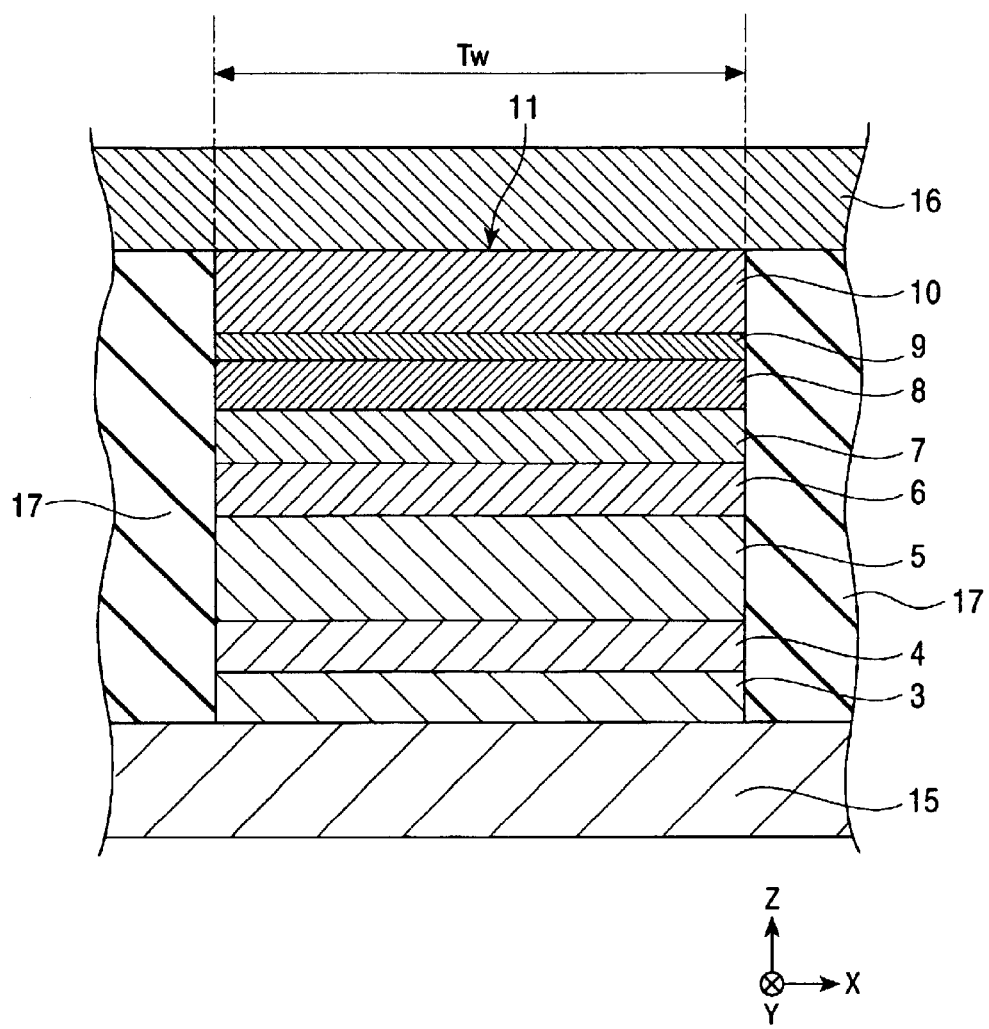

CPP MODE MAGNETIC SENSING ELEMENT INCLUDING A MULTILAYER FREE LAYER BIASED BY AN ANTIFERROMAGNETIC LAYER

This application claims the benefit of priority to Japanese Patent Application 2002-114296, filed on Apr. 17, 2002.

BACKGROUND OF THE INVENTION

1. Field of the Invention

The present invention relates to current-perpendicular-to-the-plane (CPP) magnetic sensing elements and, more particularly, to a magnetic sensing element in which read sensitivity and read output can be improved even when the track is narrowed.

2. Description of the Related Art

FIG. 7 is a partial sectional view of a conventional CIP magnetic sensing element, viewed from the surface facing a recording medium. Herein, CIP stands for current-in-the-plane, and in the CIP magnetic sensing element, a sensing current flows parallel to the planes of a multilayer film which is located in the center of the magnetic sensing element.

Referring to FIG. 7, the magnetic sensing element includes a lower shielding layer 1 composed of Permalloy (NiFe alloy) or the like and a lower gap layer 2 composed of $Al_2O_3$ or the like disposed thereon.

On the lower gap layer 2, an underlayer 3, a seed layer 4, a first antiferromagnetic layer 5, a pinned magnetic layer 6, a first nonmagnetic layer 7, a free magnetic layer 8, a second nonmagnetic layer 9, and a second antiferromagnetic layer 10 are deposited, and the laminate from the underlayer 3 to the second antiferromagnetic layer 10 is hereinafter referred to as a multilayer film 11.

The first antiferromagnetic layer 5 is composed of an antiferromagnetic material, such as a PtMn alloy, each of the pinned magnetic layer 6 and the free magnetic layer 8 is composed of a ferromagnetic material, such as a NiFe alloy, and the first nonmagnetic layer 7 is composed of a nonmagnetic conductive material, such as Cu.

End faces 11a at both sides in the track width direction (in the X direction) of the multilayer film 11 are formed by etching. Although the end faces 11a extend perpendicular to a plane (X-Y plane) parallel to the planes of the multilayer film 11 in the drawing, the end faces 11a are actually inclined planes.

A track width Tw is determined by the width in the track width direction (in the X direction) of the free magnetic layer 8. As the recording density is increased, the track width Tw is considerably decreased.

Electrode layers 12 are formed on the end faces 11a of the multilayer film 11. As shown in FIG. 7, an upper gap layer 13 composed of $Al_2O_3$ or the like extends over the multilayer film 11 and the electrode layers 12, and an upper shielding layer 14 composed of Permalloy or the like is disposed on the upper gap layer 13.

In the conventional magnetic sensing element shown in FIG. 7, the second antiferromagnetic layer 10 is formed on the free magnetic layer 8 with the second nonmagnetic layer 9 therebetween. In such a structure, unidirectional interlayer exchange coupling occurs between the second antiferromagnetic layer 10 and the free magnetic layer 8, and a unidirectional longitudinal bias magnetic field is applied to the free magnetic layer 8.

If the interlayer exchange coupling magnetic field is too strong, the sensitivity of the free magnetic layer 8 to an external magnetic field is weakened. The magnitude of the interlayer exchange coupling can be controlled by changing the thickness of the second nonmagnetic layer 9.

As track narrowing is accelerated, the means for applying the longitudinal bias magnetic field shown in FIG. 7 is considered as one of the optimum means.

As described above, the magnetic sensing element shown in FIG. 7 is a CIP magnetic sensing element in which a sensing current flows parallel to the planes of the multilayer film 11. Recently, attention is being given to a current-perpendicular-to-the-plane (CPP) magnetic sensing element in which read output can be increased even if the element is miniaturized.

FIG. 8 is a longitudinal sectional view of a CPP magnetic sensing element using the means for applying the longitudinal bias magnetic field described with reference to FIG. 7, viewed from the surface facing a recording medium.

A multilayer film 11 shown in FIG. 8 has the same structure as that shown in FIG. 7 except that electrode layers 16 and 15 are provided on the upper and lower faces in the thickness direction (in the Z direction) of the multilayer film 11, respectively, and insulating layers 17 composed of $Al_2O_3$ or the like are formed at both sides in the track width direction (in the X direction) of the multilayer film 11.

In the CPP magnetic sensing element, a sensing current flows parallel to the thickness direction of the multilayer film 11. Consequently, the electrode layers 16 and 15 are provided on the upper and lower faces in the thickness direction of the multilayer film 11, respectively.

In the CPP magnetic sensing element, in order to effectively improve the read output, the product ($\Delta R \times A$) of a change in resistance $\Delta R$ and an area A of the plane (X-Y plane) parallel to the planes of the multilayer film 11 must be increased.

An increase in the thickness h1 of the free magnetic layer 8 has been considered to be one method for gaining the product ($\Delta R \times A$) under the situation of miniaturization of the element with track narrowing.

However, if the thickness h1 of the free magnetic layer 8 is increased, the demagnetizing field of the free magnetic layer 8 is increased, resulting in a degradation in the read sensitivity $\eta$.

An attempt has been made to control the magnetization of the free magnetic layer 8 by strengthening the interlayer exchange coupling generated between the free magnetic layer 8 and the second antiferromagnetic layer 10 so as to counteract the demagnetizing field.

The strength of the interlayer exchange coupling can be controlled by changing the thickness of the second nonmagnetic layer 9 interposed between the free magnetic layer 8 and the second antiferromagnetic layer 10. However, if the interlayer exchange coupling is strengthened, although the influence of the demagnetizing field may be weakened, since a strong unidirectional longitudinal bias magnetic field is applied to the free magnetic layer 8, the magnetic reversal of the free magnetic layer 8 becomes insensitive to an external magnetic field or does not occur. As a result, it is not possible to fabricate a magnetic sensing element with excellent read sensitivity.

That is, in any case, in the conventional CPP magnetic sensing element having a structure including the means for applying the longitudinal bias magnetic field shown in FIG. 7, it is not possible to improve read sensitivity $\eta$ and read output simultaneously.

SUMMARY OF THE INVENTION

It is an object of the present invention to provide a magnetic sensing element in which both read sensitivity $\eta$ and read output are improved by the improved structure of the free magnetic layer, and which is thereby suitable for miniaturization of the element.

In accordance with the present invention, a magnetic sensing element includes a multilayer film including a first antiferromagnetic layer; a pinned magnetic layer in contact with the first antiferromagnetic layer; a first nonmagnetic layer in contact with the pinned magnetic layer; a free magnetic layer in contact with the first nonmagnetic layer, the free magnetic layer including a second free magnetic sublayer in contact with the first nonmagnetic layer, a nonmagnetic intermediate sublayer, and a first free magnetic sublayer; a second nonmagnetic layer in contact with the first free magnetic sublayer; and a second antiferromagnetic layer in contact with the second nonmagnetic layer. A current flows perpendicular to the plane of each layer in the multilayer film.

In the present invention, the free magnetic layer has a laminated ferrimagnetic structure including the first free magnetic sublayer, the second free magnetic sublayer, and the nonmagnetic intermediate sublayer disposed therebetween.

The magnetization directions of the first free magnetic sublayer and the second free magnetic sublayer are antiparallel to each other. In order to achieve an antiparallel state properly between the magnetization directions of the first free magnetic sublayer and the second free magnetic sublayer, the first free magnetic sublayer and the second free magnetic sublayer are formed so as to have different magnetic moments per unit area. The magnetic moment per unit area is determined by the product of the saturation magnetization (Ms) and the film thickness (t).

Since both the first free magnetic sublayer and the second free magnetic sublayer are composed of ferromagnetic materials, the physical thickness of the free magnetic layer corresponds to the total thickness of the first free magnetic sublayer and the second free magnetic sublayer. Since the physical thickness of the free magnetic layer can be increased in such a manner, the product of a change in resistance ΔR and an area A can be increased even if the element is miniaturized.

On the other hand, by forming the laminated ferrimagnetic structure in which the magnetization directions of the first free magnetic sublayer and the second free magnetic sublayer are antiparallel to each other, the demagnetizing field of the free magnetic layer is weakened because of a decrease in the magnetic thickness. Consequently, interlayer exchange coupling can be generated between the second antiferromagnetic layer and the free magnetic layer at an appropriate magnitude, and read sensitivity η can be improved.

That is, in the present invention, it is possible to fabricate a magnetic sensing element in which the product of a change in resistance ΔR and an area A can be increased and the read output can be improved compared to the conventional CPP magnetic sensing element shown in FIG. 8, and which has excellent read characteristics, such as satisfactory sensitivity and small hysteresis.

In the present invention, preferably, the second nonmagnetic layer is composed of at least one element selected from the group consisting of Cu, Au, Ag, and Ru. When the second nonmagnetic layer is composed of Cu, the thickness of the second nonmagnetic layer is preferably 0.5 to 8 Å.

The thickness of the second nonmagnetic layer is extremely important in the present invention. The reason for this is that the magnitude of the interlayer exchange coupling generated between the first free magnetic sublayer and the second antiferromagnetic layer is greatly influenced by the thickness of the second nonmagnetic layer. As the thickness of the second nonmagnetic layer is decreased, the interlayer exchange coupling can be strengthened. As the thickness of the second nonmagnetic layer is increased, the interlayer exchange coupling can be weakened.

The interlayer exchange coupling must have a proper magnitude. Specifically, the magnitude of the interlayer exchange coupling is preferably approximately 795 to 15,900 A/m (approximately 10 to 200 Oe). By setting the thickness of the second nonmagnetic layer as described above, it is possible to generate interlayer exchange coupling in this level. By setting the magnitude of the interlayer exchange coupling at approximately 795 to 15,900 A/m (approximately 10 to 200 Oe), alignment in a single domain state and magnetic reversal to an external magnetic field of the free magnetic layer can be satisfactory performed, and it is possible to fabricate a magnetic sensing element with excellent read characteristics.

In the present invention, preferably, the first free magnetic sublayer includes a magnetic region composed of a CoFe alloy. More preferably, the region composed of the CoFe alloy is located at the interface with the second nonmagnetic layer and has a predetermined thickness.

If the first free magnetic sublayer includes a magnetic region composed of a CoFe alloy, and in particular, if the magnetic region is located in the vicinity of the interface with the second nonmagnetic layer, the change in the magnitude of the interlayer exchange coupling generated between the first free magnetic sublayer and the second antiferromagnetic layer can be moderated with respect to the change in the thickness of the second nonmagnetic layer, for example, compared to a case in which the first free magnetic sublayer includes a magnetic region composed of a NiFe alloy in the vicinity of the interface with the second nonmagnetic layer. Therefore, the thickness of the second nonmagnetic layer can be set in a relatively wide range, and the magnetization of the free magnetic layer can be easily controlled. In particular, since the second nonmagnetic layer must have an extremely small thickness of several angstroms, it is extremely meaningful to future practical use of the CPP magnetic sensing element that the setting range of the thickness of the second nonmagnetic layer can be widened.

The magnetic region composed of the CoFe alloy also acts as a diffusion-preventing layer which prevents the diffusion of elements at the interface with the second nonmagnetic layer.

In the present invention, the magnetic region composed of the CoFe alloy may be located at the interface with the nonmagnetic intermediate sublayer and have a predetermined thickness.

In the present invention, preferably, the total thickness of the first free magnetic sublayer and the second free magnetic sublayer is 70 to 250 Å, and the difference between the thickness of the first free magnetic sublayer and the thickness of the second free magnetic sublayer is 5 to 70 Å.

In the present invention, preferably, the second antiferromagnetic layer is composed of an antiferromagnetic material containing X and Mn, wherein X is at least one element selected from the group consisting of Pt, Pd, Ir, Rh, Ru, and Os.

BRIEF DESCRIPTION OF THE DRAWINGS

FIG. 7 is a partial sectional view of a conventional CIP magnetic sensing element, viewed from the surface facing a recording medium; and FIG. 8 is a partial sectional view of a conventional CPP magnetic sensing element, viewed from the surface facing a recording medium.

DESCRIPTION OF THE PREFERRED EMBODIMENTS

Figure 1:
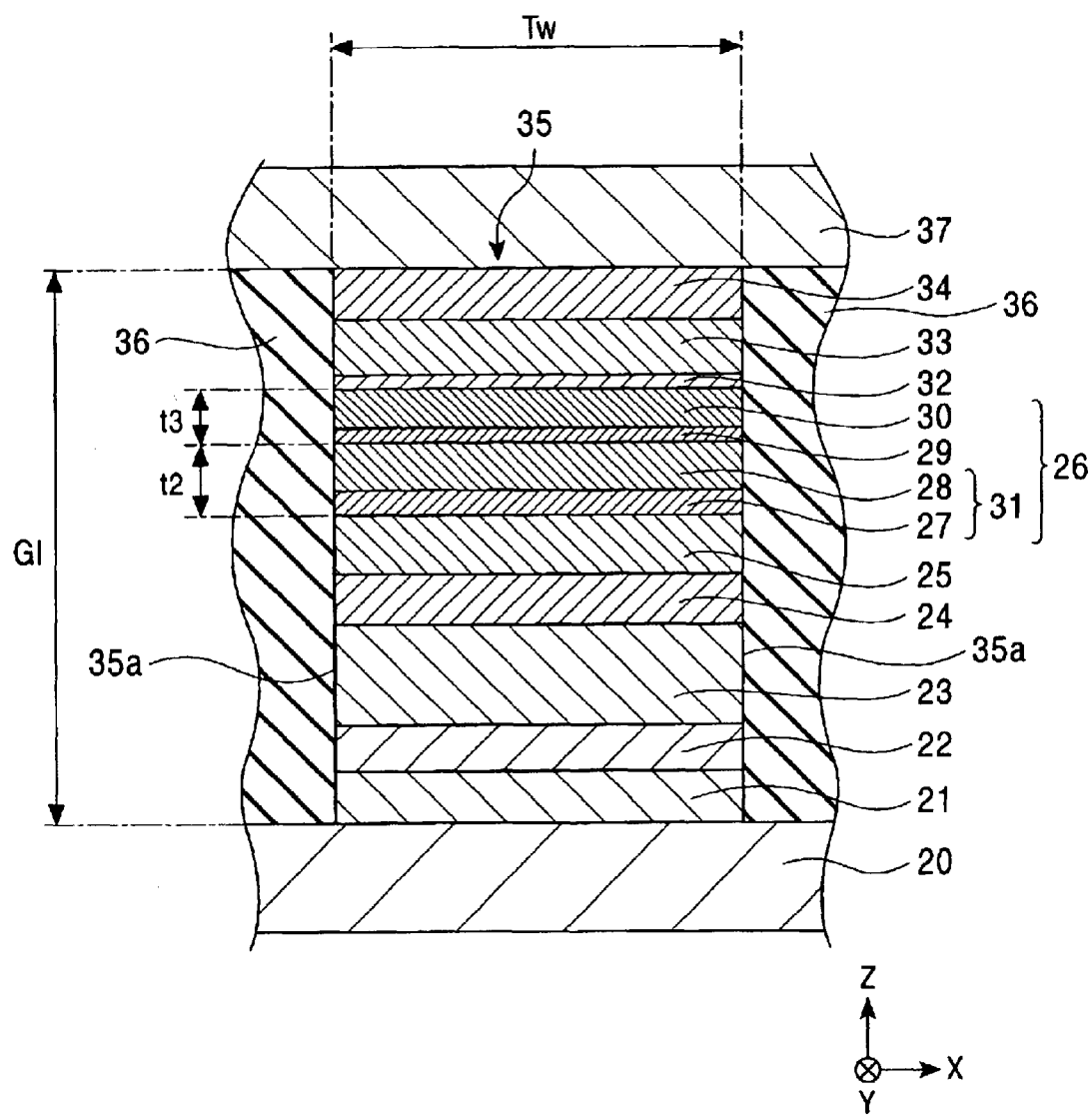
FIG. 1 is a partial sectional view of a CPP magnetic sensing element in a first embodiment of the present invention, viewed from the surface facing a recording medium.

FIG. 1 is a partial sectional view which shows an overall structure of a magnetic sensing element in a first embodiment of the present invention, viewed from the surface facing a recording medium. In FIG. 1, only the central part of the element is shown.

The magnetic sensing element shown in FIG. 1 reads the signals written in the recording medium. Although not shown in the drawing, an inductive head for writing may be deposited on the magnetic sensing element.

The magnetic sensing element is formed on the trailing end of a slider, for example, composed of alumina-titanium carbide ($Al_2O_3$-TiC). The slider is connected to an elastically deformable support composed of a stainless steel or the like at a surface opposite to the surface facing the recording medium, and thus a magnetic head device is produced.

A lower shielding layer 20 is composed of a magnetic material, such as a NiFe alloy, and also acts as a lower electrode in this embodiment.

An underlayer 21 composed of a nonmagnetic material is disposed on the lower shielding layer 20. The underlayer 21 also acts as a lower gap layer. Preferably, the underlayer 21 is composed of at least one element selected from the group consisting of Ta, Hf, Nb, Zr, Ti, Mo, and W. The underlayer 21, for example, has a thickness of approximately 50 Å or less.

A seed layer 22 is disposed on the underlayer 21. By forming the seed layer 22, the grain diameters, in a direction parallel to the planes, of the individual layers formed on the seed layer 22 can be increased, and current-carrying reliability, such as electromigration resistance, and the rate of change in resistance (ΔR/R) can be more appropriately improved.

The seed layer 22 is composed of a NiFe alloy, a NiFeCr alloy, or Cr. The seed layer 22 may be omitted.

A first antiferromagnetic layer 23 is disposed on the seed layer 22. Preferably, the first antiferromagnetic layer 23 is composed of an antiferromagnetic material containing X and Mn, wherein X is at least one element selected from the group consisting of Pt, Pd, Ir, Rh, Ru, and Os. Alternatively, preferably, the first antiferromagnetic layer 23 is composed of an antiferromagnetic material containing, X, X', and Mn, wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Such antiferromagnetic materials exhibit superior corrosion resistance and high blocking temperatures and can generate large exchange anisotropic magnetic fields at the interface with a pinned magnetic layer 24 which will be described below. Preferably, the first antiferromagnetic layer 23 has a thickness of 80 to 300 Å.

The pinned magnetic layer 24 is disposed on the first antiferromagnetic layer 23. The pinned magnetic layer 24 is composed of a ferromagnetic material, such as a CoFe alloy, a NiFe alloy, a CoFeNi alloy, or Co. In order to strengthen the exchange coupling magnetic field generated between the first antiferromagnetic layer 23 and the pinned magnetic layer 24, preferably, the pinned magnetic layer 24 is composed of a CoFe alloy. Although the pinned magnetic layer 24 shown in FIG. 1 has a single-layer structure, the structure of the pinned magnetic layer 24 is not limited thereto. Other structures for the pinned magnetic layer 24 will be described later.

As described above, an exchange coupling magnetic field is generated between the first antiferromagnetic layer 23 and the pinned magnetic layer 24 by annealing in a magnetic field, and the magnetization direction of the pinned magnetic layer 24 is pinned, for example, in the height direction (in the Y direction).

As shown in FIG. 1, a first nonmagnetic layer 25 is disposed on the pinned magnetic layer 24. The first nonmagnetic layer 25 is composed of a conductive material having a low electrical resistance, such as Cu. The first nonmagnetic layer 25 has a thickness of, for example, approximately 25 Å.

Additionally, the first nonmagnetic layer 25 may be composed of an insulating material, such as $Al_2O_3$ or $SiO_2$. Such a magnetic sensing element is referred to as a tunneling magnetoresistive element.

In the tunneling magnetoresistive element, resistance change is caused by the tunneling effect. When the magnetization directions of the pinned magnetic layer 24 and a free magnetic layer 26 are antiparallel to each other, the tunneling current least easily flows through the first nonmagnetic layer 25, resulting in the maximum resistance. When the magnetization directions of the pinned magnetic layer 24 and the free magnetic layer 26 are parallel to each other, the tunneling current most easily flows through the first nonmagnetic layer 25, resulting in the minimum resistance.

Using this principle, the varying electrical resistance due to a change in the magnetization of the free magnetic layer 26 under the influence of an external magnetic field is detected as a change in voltage, and the leakage magnetic field from the recording medium is thereby detected.

The free magnetic layer 26 is disposed on the first nonmagnetic layer 25. In this embodiment, the free magnetic layer 26 has a quadruple-layer structure. A second free magnetic sublayer 31 in contact with the first nonmagnetic layer 25 is divided into magnetic regions 27 and 28. A first free magnetic sublayer 30 is disposed on the second free magnetic sublayer 31 with a nonmagnetic intermediate sublayer 29 therebetween. In this embodiment, for example, the magnetic region 27 in contact with the first nonmagnetic layer 25 is composed of a CoFe alloy, and the magnetic region 28 is composed of a NiFe alloy.

The nonmagnetic intermediate sublayer 29 is preferably composed of at least one nonmagnetic conductive material selected from the group consisting of Ru, Rh, Ir, Os, Cr, Re, and Cu.

In this embodiment, for example, the first free magnetic sublayer 30 has a single-layer structure composed of a CoFe alloy.

As shown in FIG. 1, a second nonmagnetic layer 32 is disposed on the upper surface, i.e., a surface opposite to the surface in contact with the first nonmagnetic layer 25, of the free magnetic layer 26, and a second antiferromagnetic layer 33 is disposed on the second nonmagnetic layer 32. In the embodiment shown in FIG. 1, a protective layer 34 composed of Ta or the like is disposed on the second antiferromagnetic layer 33. The protective layer 34 may be composed of at least one element selected from the group consisting of Ta, Hf, Nb, Zr, Ti, Mo, and W. In this embodiment, the protective layer 34 also acts as an upper gap layer.

In the embodiment shown in FIG. 1, a laminate from the underlayer 21 to the protective layer 34 formed on the lower shielding layer 20 is referred to as a multilayer film 35. Although end faces 35a at both sides in the track width direction (in the X direction) of the multilayer film 35 extend perpendicular to a plane (X-Y plane) parallel to the planes of the multilayer film 35 in the drawing, the end faces 35a are actually inclined planes or curved planes, that is, the width in the track width direction of the multilayer film 35 gradually decreases in the thickness direction. The end faces 35a are formed by etching. A track width Tw is determined by the width in the track width direction of the free magnetic layer 26. The track width Tw is preferably 0.1 μm or less.

In the embodiment shown in FIG. 1, insulating layers 36 are placed at both end faces 35a of the multilayer film 35. The insulating layers 36 are placed on both ends of the lower shielding layer 20 which extends in the track width direction from the end faces 35a of the multilayer film 35. The insulating layers 36 are in contact with the end faces 35a. A specular film composed of an insulating oxide may be formed between each insulating layer 36 and each end face 35a. The formation of the specular films extends the mean free path of conduction electrons, resulting in an improvement in the rate of change in resistance. In particular, as the track is narrowed, the formation of the specular films on both end faces 35a of the multilayer film 35 becomes one of the optimum structures. The insulating layers 36 are composed of an insulating material, such as $Al_2O_3$ or $SiO_2$.

In the embodiment shown in FIG. 1, an upper shielding layer 37 extends over the multilayer film 35 and the insulating layers 36. The upper shielding layer 37 is composed of a soft magnetic material, such as a NiFe alloy, and also acts as an upper electrode.

In the embodiment shown in FIG. 1, since the lower shielding layer 20 and the upper shielding layer 37 also act as the electrodes, a gap length G1 can be determined by the total thickness of the laminate including the underlayer 21 to the protective layer 34, and the gap length G1 can be decreased.

The magnetic sensing element shown in FIG. 1 is a current-perpendicular-to-the-plane (CPP) type, in which the upper and lower shielding layers 37 and 20 which also act as the electrodes are disposed on the upper and lower surfaces of the multilayer film 35, respectively, and a current flows between the upper and lower shielding layers 37 and 20 through the multilayer film 35 in the thickness direction (in the Z direction). Since the end faces 35a of the multilayer film 35 are surrounded by the insulating layers 36, the current flows within the multilayer film 35 properly, thus improving the read output.

In the magnetic sensing element, the recording medium, such as a hard disk, travels in the Z direction. When a leakage magnetic field is applied in the Y direction from the recording medium, the magnetization direction of the second free magnetic sublayer 31 is changed from the X direction to the Y direction. Electrical resistance changes due to the relationship between the varying magnetization direction of the second free magnetic sublayer 31 and the pinned magnetization direction of the pinned magnetic layer 24, which is referred to as the magnetoresistance effect, and the leakage magnetic field from the magnetic recording medium is detected by a voltage change based on the change in the electrical resistance.

The features of the magnetic sensing element shown in FIG. 1 will be described below. In the embodiment shown in FIG. 1, the free magnetic layer 26 has a triple-layer structure including the first free magnetic sublayer 30, the second free magnetic sublayer 31, and the nonmagnetic intermediate sublayer 29 disposed therebetween. Such a structure is referred to as a laminated ferrimagnetic structure. Antiferromagnetic interlayer exchange coupling (RKKY exchange interaction) is produced between the first free magnetic sublayer 30 and the second free magnetic sublayer 31. Consequently, the magnetization directions of the first free magnetic sublayer 30 and the second free magnetic sublayer 31 are antiparallel to each other. For example, if the first free magnetic sublayer 30 is magnetized parallel to the track width direction rightward, the second free magnetic sublayer 31 is magnetized leftward in the drawing.

As shown in FIG. 1, the second antiferromagnetic layer 33 is disposed on the first free magnetic sublayer 30 with the second nonmagnetic layer 32 therebetween. Unidirectional interlayer exchange coupling is produced between the first free magnetic sublayer 30 and the second antiferromagnetic layer 33, and the first free magnetic sublayer 30 is aligned in a single domain state, for example, rightward.

However, the unidirectional interlayer exchange coupling must be relatively weak. If the interlayer exchange coupling is strong, the magnetization of the first free magnetic sublayer 30 is easily pinned rightward. In such a case, the magnetization of the second free magnetic sublayer which actually contributes to the magnetoresistance effect is easily pinned leftward due to the antiferromagnetic interlayer exchange coupling generated between the first free magnetic sublayer 30 and the second free magnetic sublayer 31, the magnetization of the second free magnetic sublayer 31 is not easily rotated in response to an external magnetic field, resulting in a decrease in output sensitivity.

The embodiment shown in FIG. 1 is characterized in that the free magnetic layer 26 has the laminated ferrimagnetic structure and that the magnetization of the free magnetic layer 26 is controlled by the second antiferromagnetic layer 33 with the second nonmagnetic layer 32 therebetween.

Since the free magnetic layer 26 has the laminated ferrimagnetic structure, the physical thickness of the free magnetic layer 26 corresponds to the total thickness of a thickness t3 of the first free magnetic sublayer 30 and a thickness t2 of the second free magnetic sublayer 31. Consequently, the physical thickness of the free magnetic layer 26 can be increased, and even if the element is miniaturized, the product of a change in resistance ΔR and an area A of the plane (X-Y plane) parallel to the planes of the multilayer film 35 can be increased.

On the other hand, the demagnetizing field of the free magnetic layer 26 is weakened because the magnetic thickness is decreased by the laminated ferrimagnetic structure in which the magnetization directions of the first free magnetic sublayer 30 and the second free magnetic sublayer 31 are antiparallel to each other. Consequently, the unidirectional interlayer exchange coupling magnetic field generated between the second antiferromagnetic layer 33 and the free magnetic layer 26 can be applied continuously to the free magnetic layer 26 in an appropriate magnitude, resulting in an improvement in the read sensitivity η.

As described above, in the present invention, it is possible to improve read sensitivity η and the read output simultaneously, and it is possible to fabricate a magnetic sensing element which is suitable for the miniaturization of the element with the future increase in the recording density.

The second nonmagnetic layer 32 is preferably composed of Cu, Au, Ag, or Ru.

Unidirectional interlayer exchange coupling is produced between the second antiferromagnetic layer 33 and the first free magnetic sublayer 30. The interlayer exchange coupling must be relatively weak. If the interlayer exchange coupling is strong, the first free magnetic sublayer 30 is strongly magnetized, and therefore, the second free magnetic sublayer 31, to which the antiferromagnetic interlayer exchange coupling with the first free magnetic sublayer 30 is applied, is also strongly magnetized, resulting in a degradation in the read sensitivity to an external magnetic field.

In order to set the unidirectional interlayer exchange coupling between the second antiferromagnetic layer 33 and the first free magnetic sublayer 30 relatively weak, the second nonmagnetic layer 32 must be composed of Cu, Au, Ag, or Ru, and the thickness of the second nonmagnetic layer 32 must be adjusted.

In the present invention, when the second nonmagnetic layer 32 is composed of Cu, the thickness of the second nonmagnetic layer 32 is preferably 0.5 to 8 Å.

By setting the thickness of the second nonmagnetic layer 32 in the range described above, the magnitude of the unidirectional interlayer exchange coupling between the first free magnetic sublayer 30 and the second antiferromagnetic layer 33 can be set at approximately 795 to 15,900 A/m (approximately 10 to 200 Oe), and thereby it is possible to prevent the first free magnetic sublayer 30 from being pinned by strong interlayer exchange coupling.

Next, the magnetic moments per unit area of the first free magnetic sublayer 30 and the second free magnetic sublayer 31 will be described below.

In the embodiment shown in FIG. 1, the first free magnetic sublayer 30 and the second free magnetic sublayer 31 have different magnetic moments per unit area. The magnetic moment per unit area is defined as the product of the saturation magnetization (Ms) and the thickness (t).

By setting the magnetic moments per unit area of the first free magnetic sublayer 30 and the second free magnetic sublayer 31 to be different from each other, the magnetization directions of the first free magnetic sublayer 30 and the second free magnetic sublayer 31 can be antiparallel to each other appropriately.

Preferably, the total thickness of the thickness t3 of the first free magnetic sublayer 30 and the thickness t2 of the second free magnetic sublayer 31 is 70 to 250 Å. By forming the free magnetic layer 26 at such a thickness, the product of the change in resistance ΔR and the area A can be effectively increased.

Preferably, the difference between the thickness t3 of the first free magnetic sublayer 30 and the thickness t2 of the second free magnetic sublayer 31 is 5 to 70 Å. By setting the difference in the thickness between the first free magnetic sublayer 30 and the second free magnetic sublayer 31 in the range described above, the demagnetizing field of the free magnetic layer 26 can be effectively weakened, and in particular, the demagnetizing field can be brought close to zero.

Preferably, the difference between the magnetic moment per unit area of the first free magnetic sublayer 30 and the magnetic moment per unit area of the second free magnetic sublayer 31 is 0.04 memu/cm$^2$ (0.5 T.nm) to 0.56 memu/cm$^2$ (7.06 T.nm). By setting the difference in the magnetic moment per unit area between the first free magnetic sublayer 30 and the second free magnetic sublayer 31 in the range described above, the demagnetizing field of the free magnetic layer 26 can be effectively weakened, and in particular, the demagnetizing field can be brought close to zero.

The material for the free magnetic layer 26 will now be described. In the embodiment shown in FIG. 1, the second free magnetic sublayer 31 has a double-layer structure. As described above, for example, the magnetic region 27 is a CoFe alloy layer and the magnetic region 28 is a NiFe alloy layer.

Since the magnetic region 27 is the CoFe alloy layer, i.e., the magnetic region composed of the CoFe alloy, is located in the vicinity of the interface with the first nonmagnetic layer 25, it is possible to appropriately prevent Ni of the magnetic region 28 from diffusing into the first nonmagnetic layer 25.

The first free magnetic sublayer 30 is composed of a CoFe alloy. By forming the first free magnetic sublayer 30 using a CoFe alloy, the variation in the magnitude of the unidirectional interlayer exchange coupling generated between the second antiferromagnetic layer 33 and the first free magnetic sublayer 30 can be moderated compared to a case in which the first free magnetic sublayer 30 is composed of a NiFe alloy.

As the thickness of the second nonmagnetic layer 32 is increased, the magnitude of the unidirectional interlayer exchange coupling between the second antiferromagnetic layer 33 and the first free magnetic sublayer 30 is decreased. As the thickness of the second nonmagnetic layer 32 is decreased, the magnitude of the interlayer exchange coupling is increased.

However, the variation in the magnitude of the interlayer exchange coupling becomes extremely large if the first free magnetic sublayer 30 is composed of a NiFe alloy. Therefore, in order to obtain required interlayer exchange coupling, the thickness of the second nonmagnetic layer 32 and the thickness of the free magnetic sublayer 30 must be set extremely strictly, resulting in a decrease in the production yield. In particular, the thickness of the second nonmagnetic layer 32 must be set at an extremely small value of several angstroms, and if the allowance of the proper thickness is small, it is not easy to form the second nonmagnetic layer 32 at a predetermined thickness.

In contrast, if the first free magnetic sublayer 30 is composed of a CoFe alloy, since the variation in the magnitude of the interlayer exchange coupling becomes relatively moderate, the allowance of the proper thicknesses for the second nonmagnetic layer 32 and the first free magnetic sublayer 30 become larger compared to a case in which the first free magnetic sublayer 30 is composed of a NiFe alloy. Consequently, the second nonmagnetic layer 32 and the first free magnetic sublayer 30 are easily formed at thicknesses within the predetermined ranges, and interlayer exchange coupling with a predetermined magnitude is easily obtained.

The materials for the magnetic layers 27, 28, and 30 described above are taken as an example, and the present invention is not limited thereto. For example, the magnetic layer 27 may be composed of Co. The magnetic layer 28 may be composed of a CoFeNi alloy. The first free magnetic sublayer 30 may be composed of a CoFeNi alloy.

The second antiferromagnetic layer 33 will now be described. The second antiferromagnetic layer 33 is preferably composed of an antiferromagnetic material containing X and Mn, wherein X is at least one element selected from the group consisting of Pt, Pd, Ir, Rh, Ru, and Os. For example, the second antiferromagnetic layer 33 is composed of a PtMn alloy.

The magnitude of the unidirectional interlayer exchange coupling between the second antiferromagnetic layer 33 and the first free magnetic sublayer 30 is also influenced by the material for the second antiferromagnetic layer 33. The first interlayer exchange coupling magnetic field must have a proper magnitude. By forming the second antiferromagnetic layer 33 using a PtMn alloy or the like, the variation in the magnitude of the interlayer exchange coupling in response to the variation in the thickness of the second nonmagnetic layer 32 can be moderated, and interlayer exchange coupling with a predetermined magnitude is easily obtained. The antiferromagnetic material containing X and Mn, wherein X is at least one element selected from the group consisting of Pt, Pd, Ir, Rh, Ru, and Os, exhibits excellent corrosion resistance, which is also desirable.

The thickness of the second antiferromagnetic layer 33 is preferably 70 to 300 Å. By setting the thickness of the second antiferromagnetic layer 33 within the range described above, interlayer exchange coupling with a predetermined magnitude is easily obtained. Additionally, the second antiferromagnetic layer 33 may be composed of an antiferromagnetic material containing, X, X', and Mn, wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Figure 2:
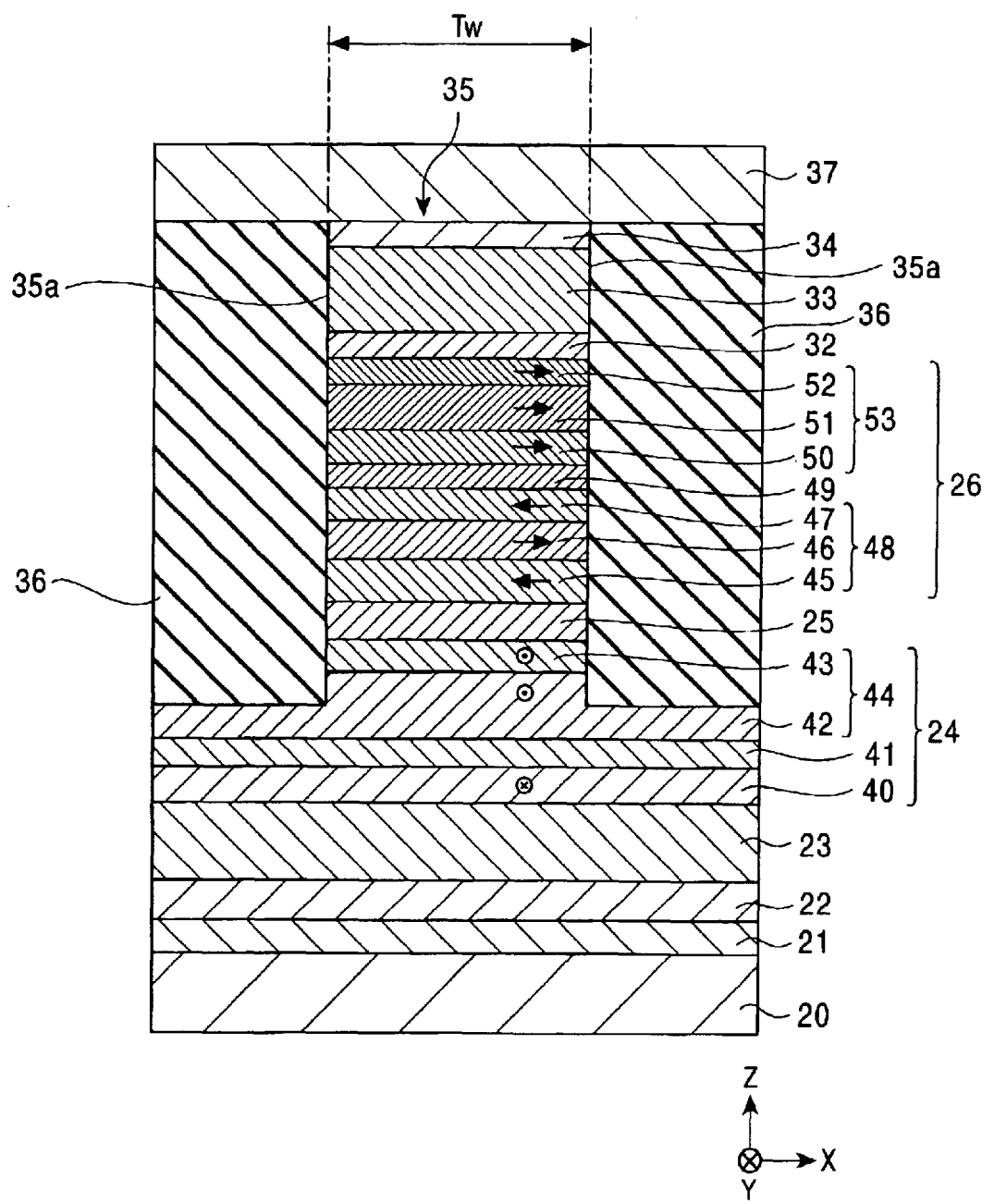
FIG. 2 is a partial sectional view of a CPP magnetic sensing element in a second embodiment of the present invention, viewed from the surface facing a recording medium.

FIG. 2 is a partial sectional view of a magnetic sensing element in a second embodiment of the present invention, viewed from the surface facing a recording medium. The same reference numerals as those in FIG. 1 are used in FIG. 2 for the same layers.

In the embodiment shown in FIG. 2, a free magnetic layer 26 also has a laminated ferrimagnetic structure, and a second nonmagnetic layer 32 and a second antiferromagnetic layer 33 are deposited on a surface of a first free magnetic sublayer 53 opposite to the surface in contact with a nonmagnetic intermediate sublayer 49.

Consequently, unidirectional interlayer exchange coupling is produced between the first free magnetic sublayer 53 and the second antiferromagnetic layer 33, and the first free magnetic sublayer 53 is aligned in a single domain state in the track width direction. The free magnetic layer 26 has the laminated ferrimagnetic structure and the physical thickness of the free magnetic layer 26 corresponds to the total thickness of the first free magnetic sublayer 53 and a second free magnetic sublayer 48. Since the physical thickness is increased, the product of the change in resistance ΔR and the area A can be improved and the read output can be improved. Since the magnetic thickness is decreased due to the laminated ferrimagnetic structure, the demagnetizing field of the free magnetic layer 26 is decreased, and a continuous bias with a proper magnitude can be stably applied from the second antiferromagnetic layer 33 to the first free magnetic sublayer 53. Therefore, it is possible to fabricate a magnetic sensing element with satisfactory read sensitivity η.

In the embodiment shown in FIG. 2, a pinned magnetic layer 24 has a laminated ferrimagnetic structure like the free magnetic layer 26. In the embodiment shown in FIG. 2, the pinned magnetic layer 24 has a quadruple-layer structure.

A first pinned magnetic sublayer 40 is, for example, composed of a CoFe alloy. A second pinned magnetic sublayer 44 is disposed on the first pinned magnetic sublayer 40 with a nonmagnetic intermediate sublayer 41 therebetween. In this embodiment, the second pinned magnetic sublayer 44 has a double-layer structure. A magnetic layer 42 is, for example, composed of a CoFe alloy, and a magnetic layer 43 is, for example, composed of a Heusler alloy.

By forming the first pinned magnetic sublayer 40 using a CoFe alloy, an exchange coupling magnetic field generated between the first antiferromagnetic layer 23 and the first pinned magnetic sublayer 40 can be increased, and the magnetization of the first pinned magnetic sublayer 40 is pinned, for example, in the height direction (in the Y direction).

On the other hand, the magnetization of the second pinned magnetic sublayer 44 is pinned in a direction opposite to the magnetization direction of the first pinned magnetic sublayer 40 by antiferromagnetic interlayer exchange coupling generated between the first pinned magnetic sublayer 40 and the second pinned magnetic sublayer 44. That is, the magnetization of the second pinned magnetic sublayer 44 is pinned in a direction opposite to the Y direction.

By forming the magnetic layer 42 composed of a CoFe alloy at the side of the second pinned magnetic sublayer 44 in contact with the nonmagnetic intermediate sublayer 41, antiferromagnetic interlayer exchange coupling with the first pinned magnetic sublayer 40 can be strengthened, and the magnetization of the second pinned magnetic sublayer 44 can be strongly pinned. Element diffusion is also prevented. The nonmagnetic intermediate sublayer 41 is preferably composed of at least one nonmagnetic conductive material selected from the group consisting of Ru, Rh Ir, Os, Cr, Re, and Cu. The thickness of the nonmagnetic intermediate sublayer 41 is preferably 4 to 12 Å, and by forming the nonmagnetic intermediate sublayer 41 thinly in such a range, the antiferromagnetic interlayer exchange coupling between the first pinned magnetic sublayer 40 and the second pinned magnetic sublayer 44 can be strengthened.

As described above, the magnetic layer 43 is, for example, composed of a Heusler alloy. The Heusler alloy is, for example, represented by the formula $X_2YZ$, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb. The Heusler alloy is a ferromagnetic and half-metallic alloy layer. Herein, the "half-metallic" property corresponds to a polarizability P of 0.5 or more. The polarizability P is represented by the relationship $P=(N\uparrow -N\downarrow )/(N\uparrow +N\downarrow )$, where $-1 \leq P \leq 1$, $N\uparrow$ is the number of spin-up conduction electrons in the vicinity of the Fermi level, and $N\downarrow$ is the number of spin-down conduction electrons in the vicinity of the Fermi level. The conduction electrons in the vicinity of the Fermi level actually contribute to conduction.

By providing the magnetic layer 43 composed of a Heusler alloy in the vicinity of the interface with the first nonmagnetic layer 25, the change in resistance ΔR can be increased, and the rate of change in resistance (ΔR/R) can be appropriately improved.

The magnetic layer 43 may be composed of $La_{0.7}Sr_{0.3}MnO_3$, $CrO_2$, or $F_3O_4$ instead of the Heusler alloy.

These are also ferromagnetic and half-metallic alloys. The magnetic layer 43 may also be composed of a commonly used ferromagnetic material, such as a CoFe alloy.

In the embodiment shown in FIG. 2, the free magnetic layer 26 has a septuple-layer structure. The magnetic layer 45, for example, composed of a Heusler alloy, the magnetic layer 46, for example, composed of a NiFe alloy, and the magnetic layer 47, for example, composed of a CoFe alloy constitute the second free magnetic sublayer 48.

As described above, by disposing the magnetic layer 45 composed of a Heusler alloy at the interface with the first nonmagnetic layer 25, the rate of change in resistance ($\Delta R/R$) can be appropriately improved. By disposing the magnetic layer 47 composed of a CoFe alloy at the interface with the nonmagnetic intermediate sublayer 49, the antiferromagnetic interlayer exchange coupling generated between the first free magnetic sublayer 53 and the magnetic layer 47 can be strengthened, and the magnetization directions of the first free magnetic sublayer 53 and the second free magnetic sublayer 48 can be maintained in the antiparallel state properly.

Additionally, when the second free magnetic sublayer 48 is entirely composed of a Heusler alloy, a CoFe alloy, or the like, the sensitivity of the second free magnetic sublayer 48 is slightly degraded. Therefore, by inserting the magnetic layer 46 composed of a NiFe alloy in the center of the second free magnetic sublayer 48, the sensitivity of the second magnetic sublayer 48 to an external magnetic field is increased.

As shown in FIG. 2, the nonmagnetic intermediate sublayer 49 is disposed on the second free magnetic sublayer 48, and preferably, the nonmagnetic intermediate sublayer 49 is composed of at least one nonmagnetic conductive material selected from the group consisting of Ru, Rh, Ir, Os, Cr, Re, and Cu. The thickness of the nonmagnetic intermediate sublayer 49 is preferably 4 to 12 Å, and by forming the nonmagnetic intermediate sublayer 49 thinly in such a range, the antiferromagnetic interlayer exchange coupling between the first free magnetic sublayer 53 and the second free magnetic sublayer 48 can be strengthened.

In FIG. 2, a layer 50 is a magnetic layer, for example, composed of a CoFe alloy, a layer 51 is a magnetic layer, for example, composed of a NiFe alloy, and a layer 52 is a magnetic layer, for example, composed of a CoFe alloy. The magnetic layers 50 to 52 constitute the first free magnetic sublayer 53.

By disposing the magnetic layer 50 composed of the CoFe alloy at the interface with the nonmagnetic intermediate sublayer 49, antiferromagnetic interlayer exchange coupling generated between the second free magnetic sublayer 48 and the magnetic layer 50 can be strengthened, and the second free magnetic sublayer 48 can be aligned in a single domain state stably. The magnetic layer 50 also acts as a diffusion-preventing layer which prevents the diffusion of elements into the nonmagnetic intermediate sublayer 49.

By disposing the magnetic layer 52 composed of the CoFe alloy at the interface with the second nonmagnetic layer 32, the unidirectional interlayer exchange coupling generated between the second antiferromagnetic layer 33 and the magnetic layer 52 can be set so as to have a proper magnitude stably, and the second free magnetic sublayer 48 can be aligned into a single domain state stably. The magnetic layer 52 also acts as a diffusion-preventing layer which prevents the diffusion of elements into the second nonmagnetic layer 32.

Although the first free magnetic sublayer 53 does not directly contribute to the change in magnetoresistance, if the magnetization of the first free magnetic sublayer 53 is not reversed appropriately in response to an external magnetic field, the magnetic reversal of the second free magnetic sublayer 48 is inhibited. Therefore, in order to increase the sensitivity of the first free magnetic sublayer 53 to an external magnetic field, the magnetic layer 51 composed of the NiFe alloy is inserted in the center of the first free magnetic sublayer 53.

In the embodiment shown in FIG. 2, end faces 35a of the multilayer film 35 in the track width direction (in the X direction) are removed from the protective layer 34 to the middle of the multilayer film 35, unlike the continuously etched faces from the protective layer 34 to the underlayer 21 shown in FIG. 1. In the embodiment shown in FIG. 2, the end faces 35a are removed, leaving the middle of the magnetic layer 42 of the second pinned magnetic sublayer 44.

The faces 35a of the multilayer film 35 extend at least to the lower layer of the free magnetic layer 26. As described above, since the track width Tw is determined by the width in the track width direction of the free magnetic layer 26, in order to properly meet track narrowing, the width of the free magnetic layer 26 must be decreased by removing the end faces 35a of at least the free magnetic layer 26. The end faces 35a may be removed to leave the middle of the layer constituting the pinned magnetic layer 24 as shown in FIG. 2, or may be removed to leave the middle of the first antiferromagnetic layer 23. Alternatively, the end faces 35a may be removed to leave both end faces of the underlayer 21 as in shown in FIG. 1.

Figure 3:
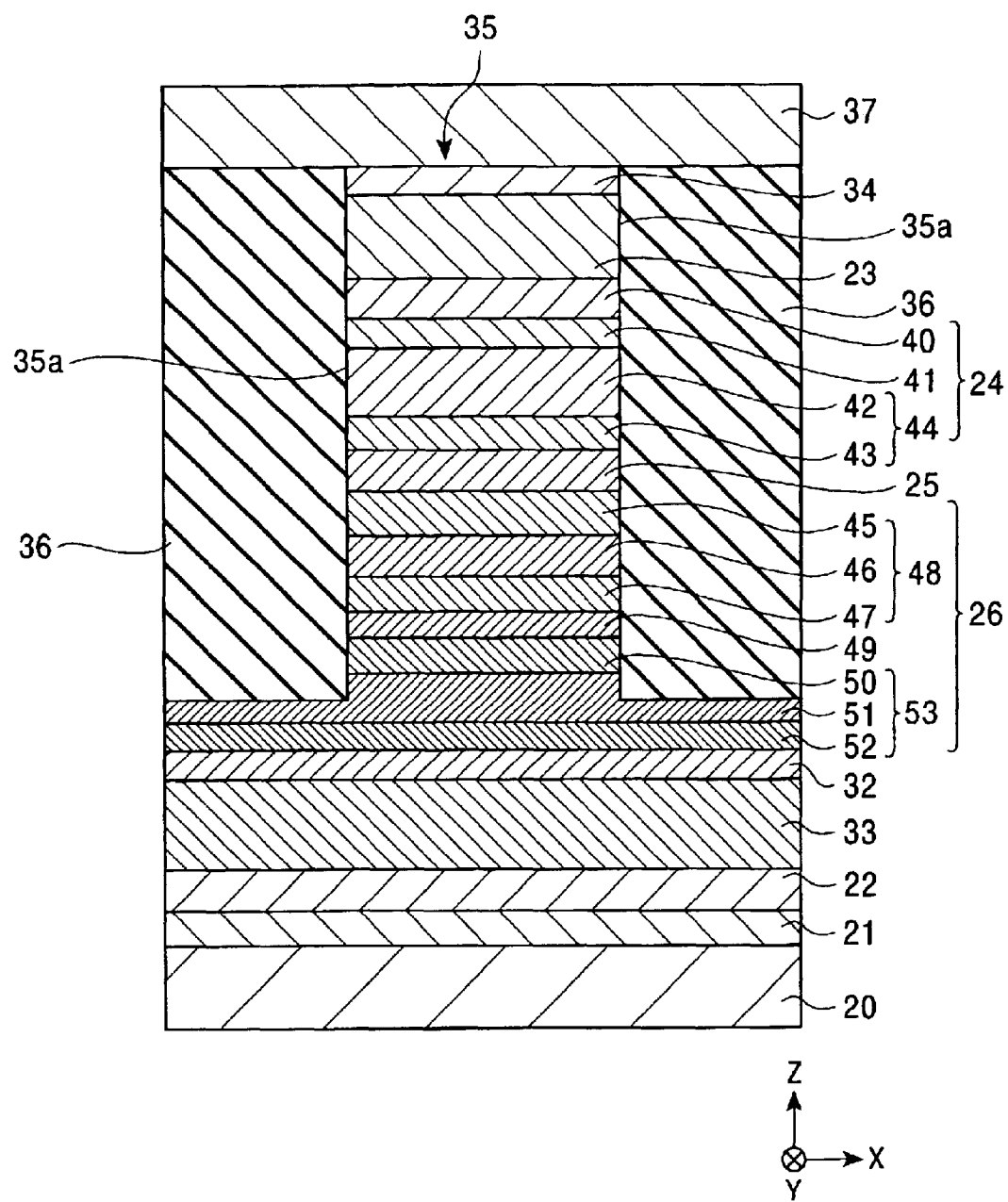
FIG. 3 is a partial sectional view of a CPP magnetic sensing element in a third embodiment of the present invention, viewed from the surface facing a recording medium.

FIG. 3 is a partial sectional view of a magnetic sensing element in a third embodiment of the present invention, viewed from the surface facing a recording medium.

In the embodiment shown in FIG. 3, the magnetic sensing element has the same structure as that of the magnetic sensing element shown in FIG. 2 except that layers between the underlayer 21 and the protective layer 34 in the multilayer film 35 shown in FIG. 2 are deposited in the reversed order.

That is, in the embodiment shown in FIG. 3, an second antiferromagnetic layer 33, a second nonmagnetic layer 32, a first free magnetic sublayer 53, a nonmagnetic intermediate sublayer 49, a second free magnetic sublayer 48, a first nonmagnetic layer 25, a second pinned magnetic sublayer 44, a nonmagnetic intermediate sublayer 41, a first pinned magnetic sublayer 40, and a first antiferromagnetic layer 23 are deposited in that order above an underlayer 21. The materials and thicknesses for the individual layers are the same as those described with reference to FIGS. 1 and 2.

In the embodiment shown in FIG. 3, the second nonmagnetic layer 32 and the second antiferromagnetic layer 33 are formed on a surface of the first free magnetic sublayer 53 opposite to the surface in contact with the nonmagnetic intermediate sublayer 49. Unidirectional interlayer exchange coupling is produced between the first free magnetic sublayer 53 and the second antiferromagnetic layer 33, and the first free magnetic sublayer 53 is aligned in a single domain state in the track width direction. The free magnetic layer 26 has a multilayered ferrimagnetic structure, and the physical thickness of the free magnetic layer 26 corresponds to the total thickness of the first free magnetic sublayer 53 and the second free magnetic sublayer 48. Since the physical thickness is increased, the product of the change in resistance $\Delta R$ and the area A can be improved and the read output can be improved. Since the magnetic thickness is decreased due to the laminated ferrimagnetic structure, the demagnetizing field of the free magnetic layer 26 is decreased, and a continuous bias with a proper magnitude can be stably applied from the second antiferromagnetic layer 33 to the first free magnetic sublayer 53. Therefore, it is possible to fabricate a magnetic sensing element with satisfactory read sensitivity η.

In the embodiment shown in FIG. 3, the end faces 35a of the multilayer film 35 is removed by etching at least to the end faces of the second free magnetic sublayer 48. The reason for this is that the second free magnetic sublayer 48 is the layer which actually contributes to the magnetoresistance effect, and the track width Tw is determined by the width in the track width direction of the second free magnetic sublayer 48. In the embodiment shown in FIG. 3, etching is performed to the end faces of the middle of the first free magnetic sublayer 53. Etching may be performed further to the lower layer.

Figure 4:
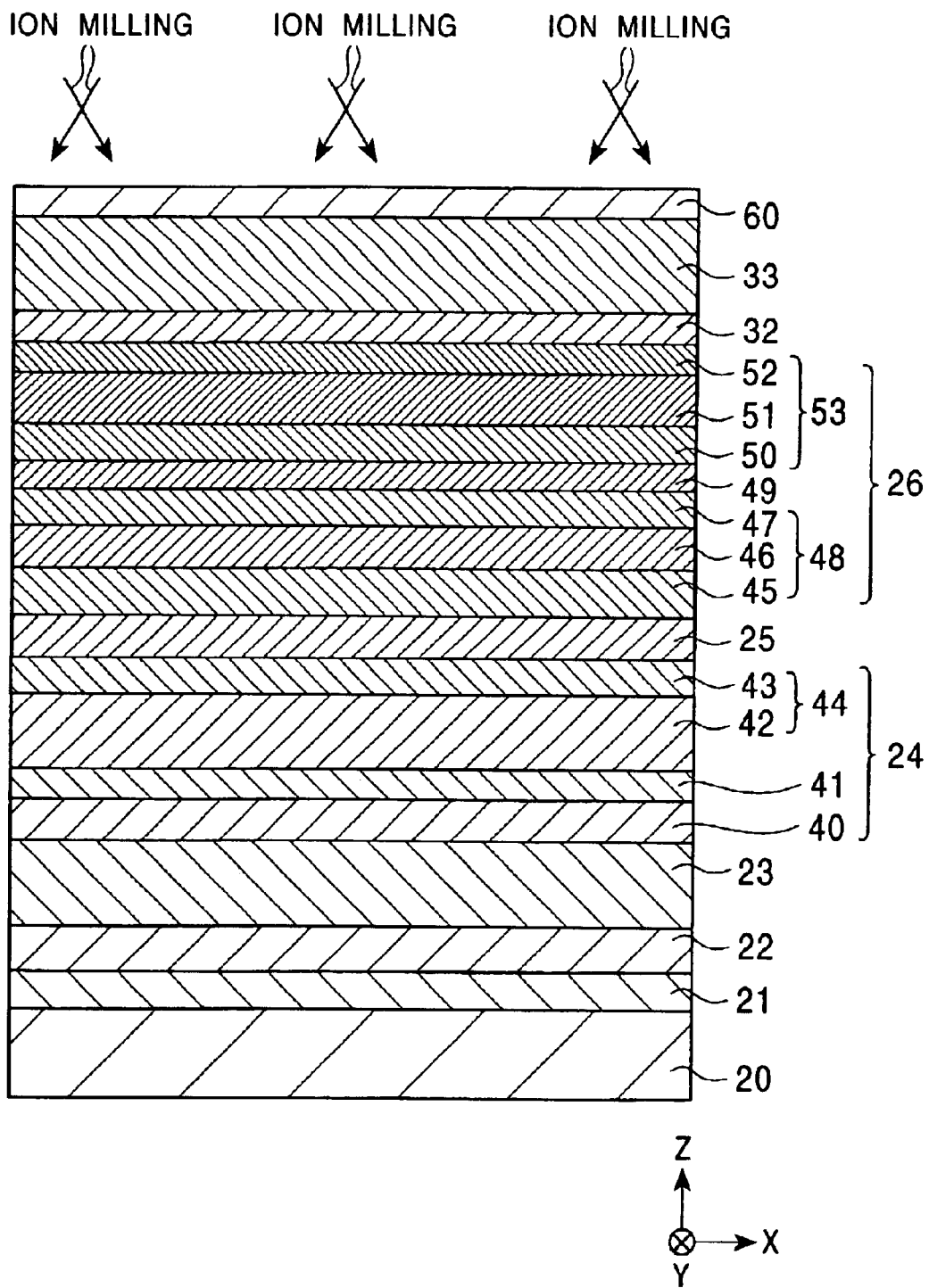
FIG. 4 is a sectional view which shows a step in a method for fabricating the magnetic sensing element shown in FIG. 2.
Figure 5:
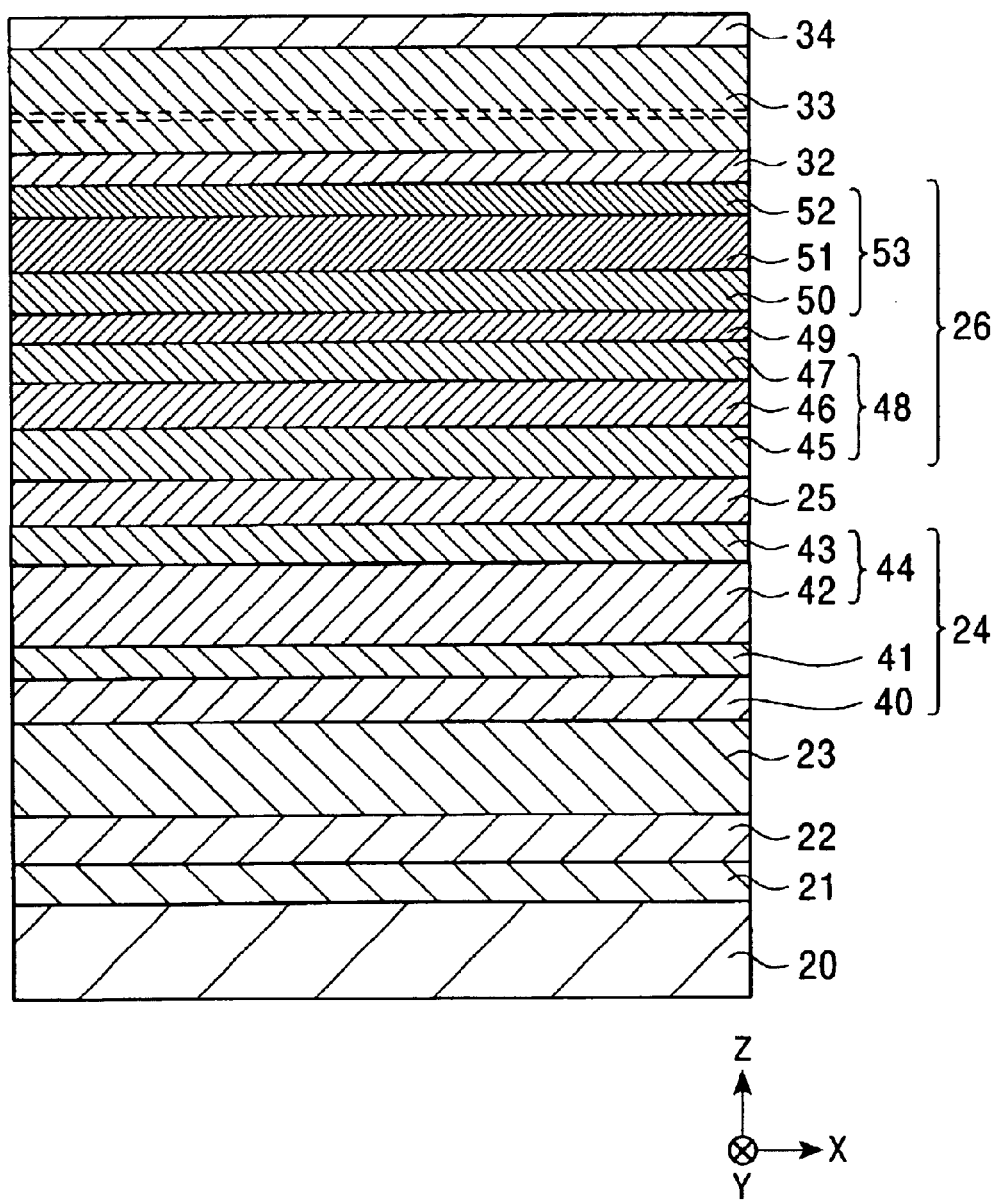
FIG. 5 is a sectional view which shows a step subsequent to the step shown in FIG. 4.
Figure 6:
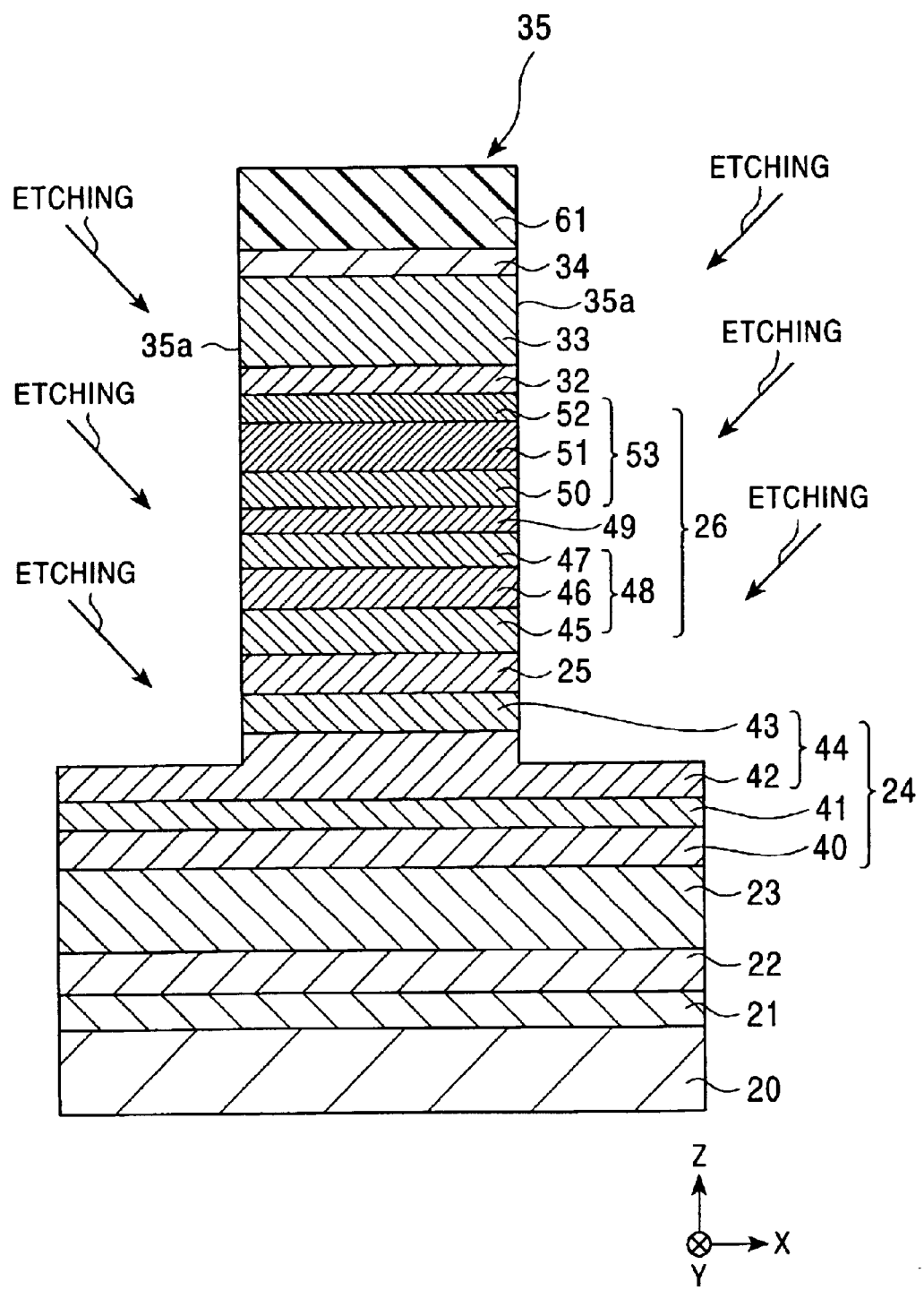
FIG. 6 is a sectional view which shows a step subsequent to the step shown in FIG. 5.

FIGS. 4 to 6 are sectional views which show the steps in a method for fabricating the magnetic sensing element shown in FIG. 2. Since a method for fabricating the magnetic sensing element shown in FIG. 1 is basically the same as that of the magnetic sensing element shown in FIG. 2, the method for fabricating the magnetic sensing element shown in FIG. 2 only will be described. Described below is considered to be a representative fabrication method among several methods for fabricating the magnetic sensing element.

In a step shown in FIG. 4, a lower shielding layer 20, an underlayer 21, a seed layer 22, a first antiferromagnetic layer 23, a first pinned magnetic sublayer 40, a nonmagnetic intermediate sublayer 41, a second pinned magnetic sublayer 44, a first nonmagnetic layer 25, a second free magnetic sublayer 48, a nonmagnetic intermediate sublayer 49, a first free magnetic sublayer 53, a second nonmagnetic layer 32, and a part of a second antiferromagnetic layer 33 are continuously formed by sputtering. The materials and the thicknesses therefor are the same as those described with reference to FIGS. 1 and 2.

The reason for forming only a part of the second antiferromagnetic layer 33 in the step shown in FIG. 4 is that if the second antiferromagnetic layer 33 is formed with a large thickness, unidirectional interlayer exchange coupling is also generated between the second antiferromagnetic layer 33 and the first free magnetic sublayer 53 by annealing in a magnetic field to produce an exchange coupling magnetic field between the first antiferromagnetic layer 23 and the first pinned magnetic sublayer 40, and it becomes difficult to align the free magnetic layer 26 in a single domain state in the track width direction in the subsequent step.

Therefore, the second antiferromagnetic layer 33 is formed thinly first such that unidirectional interlayer exchange coupling does not occur between the second antiferromagnetic layer 33 and the first free magnetic sublayer 53 even by annealing in a magnetic field. Specifically, the thickness of the second antiferromagnetic layer 33 is set at 50 Å or less.

As shown in FIG. 4, a protective layer 60, for example, composed of Ru is formed by sputtering on the second antiferromagnetic layer 33. The protective layer 60 is provided so as to properly prevent the second antiferromagnetic layer 33 from being oxidized. When the protective layer 60 is composed of Ru, Cr, or the like, even if the protective layer 60 is formed at an extremely small thickness, the protective layer 60 functions as an oxidation-inhibiting layer satisfactorily, which is advantageous compared to a case in which the protective layer 60 must be formed thickly. The protective layer 60 is scraped off in the subsequent step, and since the protective layer 60 is extremely thin, the protective layer 60 can be removed by an ion milling process with low energy. Thereby, the second antiferromagnetic layer 33 below the protective layer 60 is not substantially influenced by ion milling. The thickness of the protective layer 60 is preferably 10 Å or less, and more preferably 5 Å or less.

After the multilayer film shown in FIG. 4 is formed, a first annealing process is performed in a first magnetic field. Consequently, an exchange coupling magnetic field is generated between the first antiferromagnetic layer 23 and the first pinned magnetic sublayer 40, and for example, the magnetization of the first pinned magnetic sublayer 40 is pinned in the height direction (in the Y direction). On the other hand, the magnetization of the second pinned magnetic layer 44 is pinned in a direction opposite to the Y direction by interlayer coupling between the first pinned magnetic sublayer 40 and the second pinned magnetic sublayer 44. In the first annealing process, for example, the annealing temperature is set at 270° C. and the magnitude of the magnetic field is set at 800 kA/m.

Next, the protective layer 60 is scraped off by ion milling with low energy. The protective layer 60 may be completely removed, or a part of the protective layer 60 may be left. For example, if the thickness of the remaining protective layer 60 is 3 Å or less, antiferromagnetic characteristics of the second antiferromagnetic layer 33 are not degraded.

In the step shown in FIG. 5, the rest of the second antiferromagnetic layer 33 is formed by sputtering on the second antiferromagnetic layer 33 which has been partially formed in the step shown in FIG. 4 to complete the second antiferromagnetic layer 33 with a predetermined thickness. A protective layer 34 composed of Ta or the like is formed on the second antiferromagnetic layer 33. Additionally, as indicated by dotted lines in FIG. 5, the protective layer 60 composed of Ru or the like may be partially left, and in such a case, the element constituting the protective layer 60 is diffused in the second antiferromagnetic layer 33 in an annealing process subsequently performed in a magnetic field.

Next, a second annealing process in a second magnetic field is performed. The second annealing process is performed in order to control the magnetization direction of the free magnetic layer 26, and the second magnetic field is oriented in the track width direction.

For example, if the first free magnetic sublayer 53 is magnetized rightward by the second annealing process, the second free magnetic sublayer 48 is magnetized leftward in the drawing. In the second annealing process, for example, the annealing temperature is set at 250° C. and the magnitude of the magnetic field is set at 24 kA/m.

The annealing temperature in the second annealing process must be lower than the blocking temperature at which the exchange coupling magnetic field by the first antiferromagnetic layer 23 is lost, and the magnitude of the second magnetic field must be smaller than the magnitude of the exchange coupling magnetic field between the first antiferromagnetic layer 23 and the first pinned magnetic sublayer 40. Otherwise, the magnetization of the pinned magnetic layer 24 is fluctuated by the second annealing process.

Next, in the step shown in FIG. 6, a resist layer 61 having a predetermined shape is formed on the protective layer 34. The width in the track width direction (in the X direction) of the resist layer 61 is set as small as possible because the width in the track width direction of the free magnetic layer 26, which corresponds to the track width Tw, is restricted by the width of the resist layer 61.

As shown in FIG. 6, end faces 35a not covered with the resist layer 61 are removed by etching. The insulating layers 36 shown in FIG. 2 are then formed on the end faces 35a, and the resist layer 61 is removed. The upper shielding layer 37 is formed over the insulating layers 36 and the protective layer 34 by plating or sputtering.

In order to fabricate the magnetic sensing element shown in FIG. 3, layers up to a part of the first antiferromagnetic layer 23 are formed solidly by sputtering, and the protective layer 60 composed of Ru or the like described with reference to FIG. 4 is formed thereon. Unidirectional exchange coupling is produced between the second antiferromagnetic layer 33 and the first free magnetic sublayer 53 by a first annealing process in a first magnetic field. The protective layer 60 is removed by ion milling with low energy, and the rest of the first antiferromagnetic layer 23 is formed thereon to complete the first antiferromagnetic layer 23 with a predetermined thickness. A second annealing process in a second magnetic field is performed to produce an exchange coupling magnetic field between the first antiferromagnetic layer 23 and the first pinned magnetic sublayer 40. The subsequent step is the same as that shown in FIG. 6.

Additionally, magnetic sensing elements of the present invention can also be used for magnetic heads for tape recording, magnetic sensors, etc., in addition to thin-film magnetic heads built in hard disk apparatuses.

As described above in detail, in accordance with the present invention, for example, a first antiferromagnetic layer, a pinned magnetic layer, a first nonmagnetic layer, a second free magnetic sublayer, a nonmagnetic intermediate sublayer, a first free magnetic sublayer, a second nonmagnetic layer, and a second antiferromagnetic layer are deposited in that order from the bottom.

Consequently, unidirectional interlayer exchange coupling is generated between the first free magnetic sublayer and the second antiferromagnetic layer, and the first free magnetic sublayer is aligned in a single domain state in the track width direction. The free magnetic layer has a laminated ferrimagnetic structure. The physical thickness of the free magnetic layer corresponds to the total thickness of the first free magnetic sublayer and the second free magnetic sublayer. Since the physical thickness of the free magnetic layer is increased, the product of a change in resistance ΔR and an area A can be improved, resulting in an improvement in read output. In the laminated ferrimagnetic structure, since the magnetic thickness is decreased, the demagnetizing field of the free magnetic layer is weakened, and it is possible to stably apply a continuous bias with a proper magnitude from the second antiferromagnetic layer to the first free magnetic sublayer. Therefore, it is possible to fabricate a magnetic sensing element with satisfactory read sensitivity η.

In accordance with the present invention, it is possible to provide a magnetic sensing element in which both read output and read sensitivity can be improved even if the element is miniaturized.

What is claimed is:

1. A magnetic sensing element comprising a multilayer film comprising:

a first antiferromagnetic layer;

a pinned magnetic layer in contact with the first antiferromagnetic layer;

a first nonmagnetic layer in contact with the pinned magnetic layer;

a free magnetic layer in contact with the first nonmagnetic layer, the free magnetic layer comprising a second free magnetic sublayer in contact with the first nonmagnetic layer, a nonmagnetic intermediate sublayer, and a first free magnetic sublayer;

a second nonmagnetic layer in contact with the first free magnetic sublayer; and a second antiferromagnetic layer in contact with the second nonmagnetic layer, wherein a current flows perpendicular to a plane of each layer, a total thickness of the first free magnetic sublayer and the second free magnetic sublayer is 70 to 250 Å, and a difference between a thickness of the first free magnetic sublayer and a thickness of the second free magnetic sublayer is 5 to 70 Å.

2. A magnetic sensing element according to claim 1, wherein the second nonmagnetic layer comprises at least one element selected from the group consisting of Cu, Au, Ag, and Ru.

3. A magnetic sensing element according to claim 2, wherein the second nonmagnetic layer comprises Cu and a thickness of the second nonmagnetic layer is 0.5 to 8 Å.

4. A magnetic sensing element according to claim 1, wherein the first free magnetic sublayer includes a magnetic region comprising a CoFe alloy.

5. A magnetic sensing element according to claim 4, wherein the magnetic region comprising the CoFe alloy is located at an interface with the second nonmagnetic layer and has a predetermined thickness.

6. A magnetic sensing element according to claim 5, wherein the magnetic region comprising the CoFe alloy is located at an interface with the nonmagnetic intermediate sublayer and has a predetermined thickness.

7. A magnetic sensing element according to claim 4, wherein the magnetic region comprising the CoFe alloy is located at an interface with the nonmagnetic intermediate sublayer and has a predetermined thickness.

8. A magnetic sensing element according to claim 1, wherein the second antiferromagnetic layer comprises an antiferromagnetic material containing X and Mn, wherein X is at least one element selected from the group consisting of Pt, Pd Ir, Rh, Ru, and Os.

* * * * *